(12) United States Patent  
Hirayama (10) Patent No.: US 9,900,530 B2
(45) Date of Patent: Feb. 20, 2018

(54) IMAGE SENSING SYSTEM (71) Applicant: CANON KABUSHIKI KAISHA, Tokyo (JP)

(72) Inventor: Satoshi Hirayama, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/963,852

(22) Filed: Dec. 9, 2015

(65) Prior Publication Data
US 2016/0173798 A1 Jun. 16, 2016

(30) Foreign Application Priority Data

Dec. 15, 2014 (JP) .................................. 2014-253532

(51) Int. Cl.
H04N 5/359 (2011.01)
H01L 27/146 (2006.01)
H04N 5/374 (2011.01)

(52) U.S. Cl.
CPC ......... H04N 5/359 (2013.01); H01L 27/1463 (2013.01); H01L 27/14605 (2013.01); H01L 27/14612 (2013.01); H01L 27/14643 (2013.01); H04N 5/374 (2013.01)

(58) Field of Classification Search
CPC ...... H04N 5/359; H04N 5/3595; H04N 5/369; H04N 5/3696; H04N 5/374; H04N 5/37457; H01L 27/1463; H01L 27/14643–27/14645; H01L 27/14603; H01L 27/14605; H01L 27/14607
See application file for complete search history.

(56) References Cited

U.S. PATENT DOCUMENTS

2011/0134270 A1* 6/2011 Arishima ............ H01L 27/1463
348/222.1
2011/0234836 A1* 9/2011 Machida ........... H01L 27/14603
348/222.1

FOREIGN PATENT DOCUMENTS

| JP | 2006173634 A | 6/2006 |
|----|--------------|--------|
| JP | 2009272539 A | 11/2009 |
| JP | 2010021450 A | 1/2010 |
| JP | 2011103359 A | 5/2011 |
| JP | 2011176366 A | 9/2011 |
| JP | 2013165279 A | 8/2013 |

* cited by examiner

Primary Examiner — Paul Berardesca
(74) Attorney, Agent, or Firm — Canon USA, Inc., IP Division (57) ABSTRACT A distance between a first accumulation region of a first pixel and a first isolation region is larger than a distance between the first accumulation region and a second isolation region, and a distance between a second accumulation region of a second pixel and a third isolation region is larger than a distance between the second accumulation region and a fourth isolation region.

17 Claims, 6 Drawing Sheets

IMAGE SENSING SYSTEM

BACKGROUND OF THE INVENTION

Field of the Invention

The present invention relates to an image sensing apparatus.

Description of the Related Art

In an image sensing apparatus used in a camera, the larger a distance from a center of an image sensing region to a pixel is, the larger an incident angle of light incident on the pixel is, and thus crosstalk is more likely to occur. The occurrence of crosstalk reduces image quality. When the layout of pixels is done so that it has translational symmetry in the entire image sensing region, the amount of crosstalk varies between directions of incident light.

Japanese Patent Laid-Open No. 2011-103359 discloses a solid-state image sensing element in which the layout relationship between unit pixels each including a light-receiving portion, a transfer gate unit, and a multilayer wiring layer is symmetrical with respect to a center line of a pixel array.

In Japanese Patent Laid-Open No. 2011-103359, suppression of crosstalk caused by an electric charge generated by photoelectric conversion has not been considered sufficiently.

SUMMARY OF THE INVENTION

According to an aspect of the present invention, an image sensing system includes a plurality of pixels arranged in an image sensing region which is a quadrilateral having a first side and a second side facing the first side, and the plurality of pixels each include a photoelectric conversion portion. The plurality of pixels include a first pixel disposed at a location closer to the first side than the second side, a second pixel disposed at a location closer to the second side than the first side, a third pixel adjacent to the first pixel on a first-side side of the first pixel, a fourth pixel adjacent to the second pixel on a second-side side of the second pixel, a fifth pixel adjacent to the first pixel on a second-side side of the first pixel, and a sixth pixel adjacent to the second pixel on a first-side side of the second pixel. A photoelectric conversion portion of the first pixel includes a first accumulation region which is a first conductivity-type semiconductor region that accumulates a signal electric charge. A first isolation region which is a second conductivity-type semiconductor region is provided between the photoelectric conversion portion of the first pixel and a photoelectric conversion portion of the third pixel, a second isolation region which is a second conductivity-type semiconductor region is provided between the photoelectric conversion portion of the first pixel and a photoelectric conversion portion of the fifth pixel, the first isolation region and the second isolation region are disposed at locations deeper from a light-receiving surface than the first accumulation region, and a distance between the first accumulation region and the first isolation region is larger than a distance between the first accumulation region and the second isolation region. A photoelectric conversion portion of the second pixel includes a second accumulation region which is a first conductivity-type semiconductor region that accumulates a signal electric charge. A third isolation region which is a second conductivity-type semiconductor region is provided between the photoelectric conversion portion of the second pixel and a photoelectric conversion portion of the fourth pixel, a fourth isolation region which is a second conductivity-type semiconductor region is provided between the photoelectric conversion portion of the second pixel and a photoelectric conversion portion of the sixth pixel, the third isolation region and the fourth isolation region are disposed at locations deeper from the light-receiving surface than the second accumulation region, and a distance between the second accumulation region and the third isolation region is larger than a distance between the second accumulation region and the fourth isolation region.

Further features of the present invention will become apparent from the following description of exemplary embodiments with reference to the attached drawings.

DESCRIPTION OF THE EMBODIMENTS

Exemplary embodiments for implementing the present invention will be described below with reference to the drawings. In the following description and drawings, it is noted that a component common to a plurality of drawings is denoted by a common reference numeral. Thus, common components will be described with reference to the plurality of drawings in turn, and descriptions of components denoted by respective common reference numerals are omitted as appropriate.

Figure 1A:
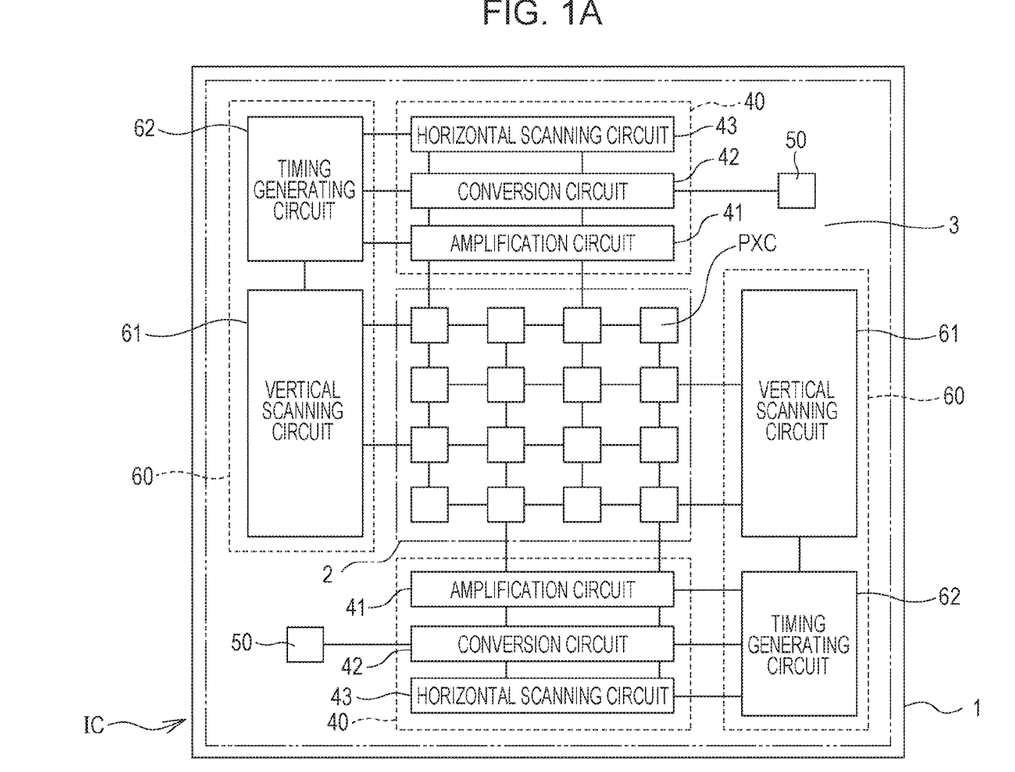
FIGS. 1A to 1C are schematic diagrams illustrating examples of an image sensing apparatus and an image sensing system.

FIG. 1A illustrates an overview of an image sensing device IC constituting all or part of an image sensing apparatus. The image sensing device IC is a semiconductor device having an integrated circuit, and the image sensing apparatus is a semiconductor apparatus. The semiconductor device can be a semiconductor chip obtained by dicing a semiconductor wafer.

The image sensing device IC has an image sensing region 2 and a peripheral region 3 on a common substrate 1. Pixel circuits PXC are arranged in a matrix in the image sensing region 2. Peripheral circuits are disposed in the peripheral region 3. In FIG. 1A, the image sensing region 2 is a region surrounded by a dashed-dotted line, and functions as a light-receiving portion. The peripheral region 3 is a region between the dashed-dotted line and a dashed double-dotted line, and surrounds the image sensing region 2. Examples of the peripheral circuits disposed in the peripheral region 3 include signal processing units 40, output units 50, and drive units 60. The signal processing units 40 are provided for columns of the pixel circuits PXC, and process signals from the pixel circuits PXC. The signal processing units 40 according to this exemplary embodiment include amplification circuits 41 having a plurality of column amplifiers, conversion circuits 42 having a plurality of column AD converters, and horizontal scanning circuits 43 for selecting outputs from the respective conversion circuits 42 and outputting them to the respective output units 50. The drive units 60 according to this exemplary embodiment include vertical scanning circuits 61 that are provided for rows of the pixel circuits PXC and drive the pixel circuits PXC, and timing generating circuits 62 for controlling operation timings of the horizontal scanning circuits 43 and the vertical scanning circuits 61.

Figure 1B:
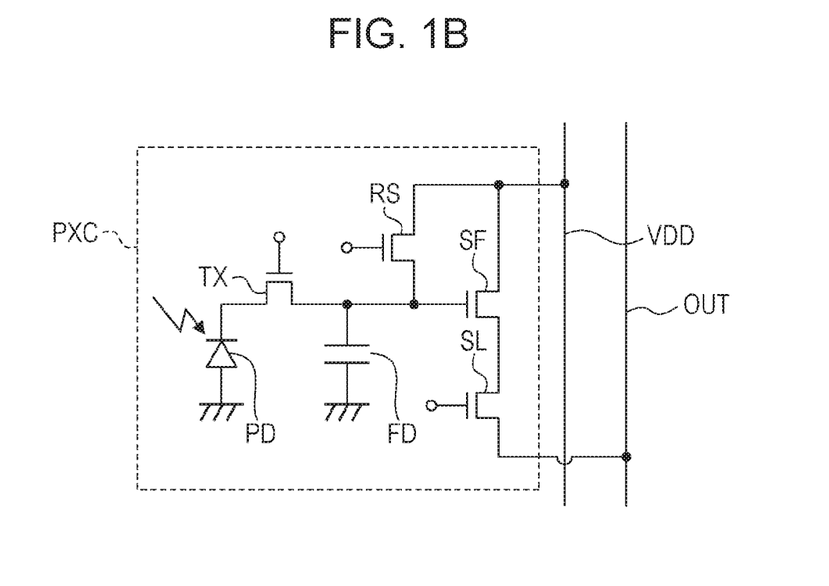

FIG. 1B illustrates an example of a circuit configuration of each pixel circuit PXC. The pixel circuit PXC is constituted by a plurality of metal-oxide-semiconductor (MOS) transistors. Here, a transfer transistor TX, an amplification transistor SF, a selection transistor SL, and a reset transistor RS are MOS transistors. The transistors disposed in the image sensing region 2 are collectively referred to as pixel transistors. Although all the pixel transistors are N-type MOS transistors in this exemplary embodiment, the pixel circuit PXC can be constituted by both N-type MOS transistors and P-type MOS transistors, or by only P-type MOS transistors. Furthermore, at least one of the transistors constituting the pixel circuit PXC may be a transistor, such as a junction field effect transistor (JFET) or bipolar transistor, other than a MOS transistor.

A gate of the transfer transistor TX functions as an electric charge transfer unit that transfers a signal electric charge generated in a photoelectric conversion portion PD to an electric charge detection unit FD. The photoelectric conversion portion PD is constituted by a photodiode, and functions as a source of the transfer transistor TX. The electric charge detection unit FD is constituted by a floating diffusion, and functions as a drain of the transfer transistor TX. The electric charge detection unit FD is connected to a gate of the amplification transistor SF, a power supply line VDD is connected to a drain of the amplification transistor SF, and an output line OUT is connected to a source of the amplification transistor SF. The amplification transistor SF constitutes a source follower circuit, and outputs a signal responsive to a potential of the electric charge detection unit FD to the output line OUT. The selection transistor SL performs ON/OFF switching of output from the pixel circuit PXC, and the reset transistor RS resets the potential of the electric charge detection unit FD to a reset potential. In this exemplary embodiment, a potential supplied from the power supply line VDD is used as a reset potential. In addition to the transfer transistor TX, the amplification transistor SF, and the reset transistor RS, a switch transistor that performs capacitance switching of the electric charge detection unit FD can be included. Furthermore, some of signal processing circuits disposed for each column of the pixel circuits PXC may be incorporated into each pixel circuit PXC.

Figure 1C:
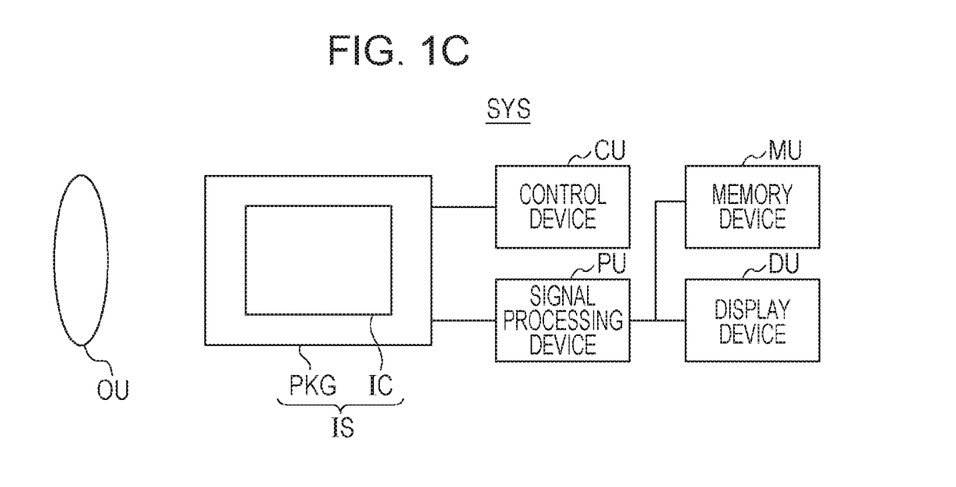

FIG. 1C illustrates an example of the configuration of an image sensing system SYS constructed with an image sensing apparatus IS. The image sensing system SYS is an information terminal having a camera or a photographing function. The image sensing apparatus IS can further include a package PKG that houses the image sensing device IC. The package PKG can include a base to which the image sensing device IC is fastened, a lid, such as a glass, facing a semiconductor substrate, and a connection member, such as a bonding wire or a bump, connecting a terminal provided in the base to a terminal provided in the image sensing device IC. In the image sensing apparatus IS, a plurality of image sensing devices IC can be installed side by side in a common package PKG. Furthermore, in the image sensing apparatus IS, the image sensing device IC and another semiconductor device IC can be installed in the common package PKG so that they are stacked on top of each other.

The image sensing system SYS can include an optical system OU that forms an image on the image sensing apparatus IS. The optical system OU can be a non-telecentric optical system. Furthermore, the image sensing system SYS can include at least any of a signal processing device PU that processes a signal output from the image sensing apparatus IS, a display device DU that displays an image acquired by the image sensing apparatus IS, a memory device MU that stores an image acquired by the image sensing apparatus IS, and a control device CU that controls devices of the image sensing system SYS.

Figure 2A:
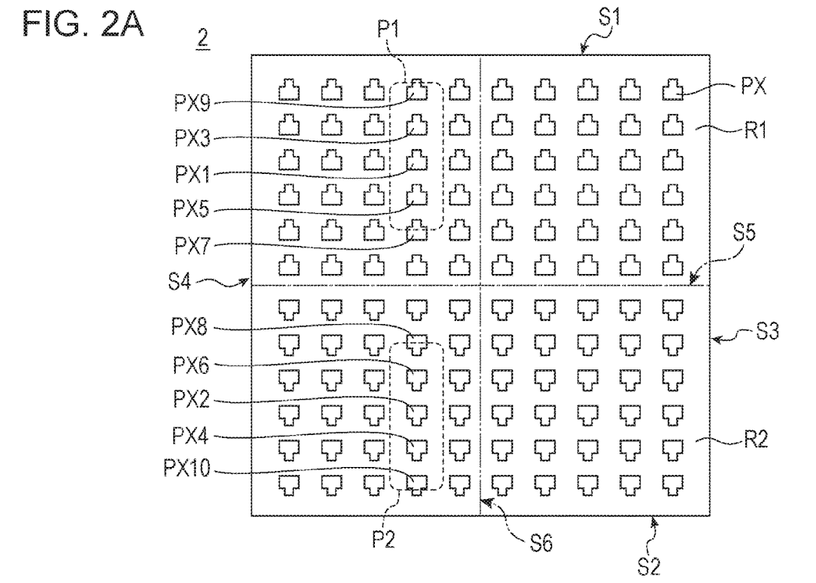
FIGS. 2A and 2B are schematic diagrams each illustrating an example of the image sensing apparatus.

FIG. 2A illustrates a planar layout of the image sensing region 2 illustrated in FIG. 1A. A plurality of pixels PX which are parts of the respective pixel circuits PXC are arranged in the image sensing region 2, and each pixel PX is represented by a schematic figure. The pixel PX includes at least one photoelectric conversion portion PD. A pixel transistor of a pixel circuit PXC can be shared among a plurality of pixels PX. The case where the orientations of figures representing pixels PX are the same means that these pixels PX share a common planar layout in a particular aspect. The particular aspect will be described later.

The image sensing region 2 is a quadrilateral having four sides: sides S1, S2, S3, and S4. Each of the sides S1, S2, S3, and S4 corresponds to a boundary between the image sensing region 2 and the peripheral region 3. The peripheral region 3 is a region in which no pixel circuits PXC periodically arranged in the image sensing region 2 are disposed. Outside the boundary between the image sensing region 2 and the peripheral region 3, a layout different from the layout of the pixel circuits PXC periodically arranged in the image sensing region 2 is placed. In the peripheral region 3, a dummy region having the same layout as that of the pixel circuits PXC can be provided, although it does not function as pixel circuits PXC. The side S2 and the side S1 vertically face each other, and the side S4 and the side S3 horizontally face each other. A line between the side S1 and the side S2 is an intermediate line S5, and a line between the side S3 and the side S4 is an intermediate line S6. Although, in this exemplary embodiment, the intermediate line S5 is located equidistant from the side S1 and the side S2, and the intermediate line S6 is located equidistant from the side S3 and the side S4, the locations of the intermediate lines S5 and S6 are not limited to these. A region between the side S1 and the intermediate line S5 is referred to as a first region R1, and a region between the side S2 and the intermediate line S5 is referred to as a second region R2. A center of the image sensing region 2 is located equidistant from the side S1 and the side S2 and is located equidistant from the side S3 and the side S4. In the example of FIG. 2A, an intersection point of the intermediate line S5 and the intermediate line S6 is the center of the image sensing region 2. It is desirable that an optical axis of the optical system OU of the image sensing system SYS coincide with the center of the image sensing region 2.

A first pixel PX1 is provided in a first portion P1 which is part of the first region R1. The first pixel PX1 is disposed at a location closer to the first side S1 than the second side S2. A second pixel PX2 is provided in a second portion P2 which is part of the second region R2. The second pixel PX2 is disposed at a location closer to the second side S2 than the first side S1. In this exemplary embodiment, the first pixel PX1 and the second pixel PX2 are located equidistant from the intermediate line S5.

In the first portion P1, there are further provided a third pixel PX3, a fifth pixel PX5, a seventh pixel PX7, and a ninth pixel PX9. The third pixel PX3 is adjacent to the first pixel PX1 on a first side S1 side of the first pixel PX1, and the fifth pixel PX5 is adjacent to the first pixel PX1 on a second side S2 side of the first pixel PX1. The seventh pixel PX7 is adjacent to the fifth pixel PX5 on a second side S2 side of the fifth pixel PX5, and the ninth pixel PX9 is adjacent to the third pixel PX3 on a first side S1 side of the third pixel PX3.

In the second portion P2, there are further provided a fourth pixel PX4, a sixth pixel PX6, an eighth pixel PX8, and a tenth pixel PX10. The fourth pixel PX4 is adjacent to the second pixel PX2 on a second side S2 side of the second pixel PX2, and the sixth pixel PX6 is adjacent to the second pixel PX2 on a first side S1 side of the second pixel PX2. The eighth pixel PX8 is adjacent to the sixth pixel PX6 on a first side S1 side of the sixth pixel PX6, and the tenth pixel PX10 is adjacent to the fourth pixel PX4 on a second side S2 side of the fourth pixel PX4.

Figure 2B:
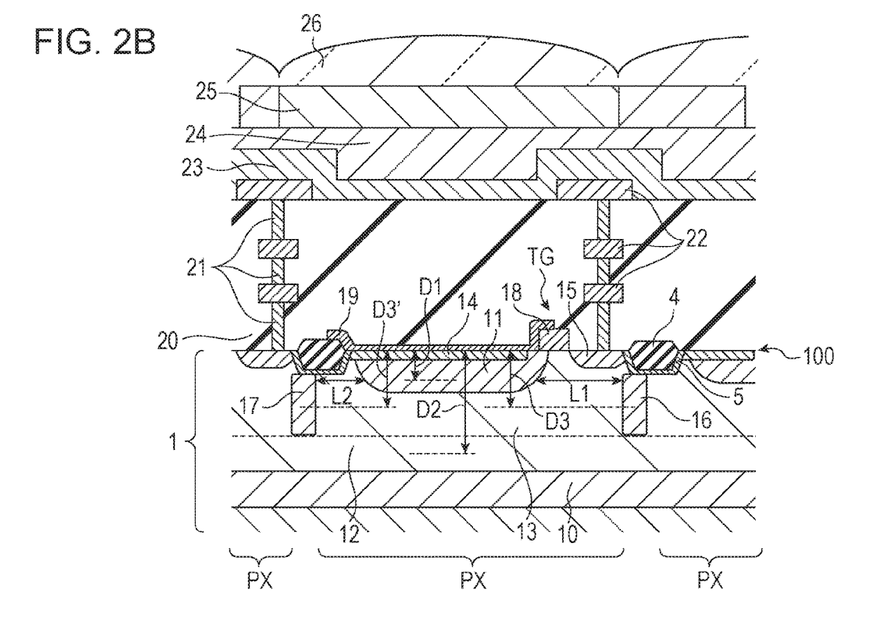

FIG. 2B illustrates a pixel PX cross-sectional structure common to the first pixel PX1 to the tenth pixel PX10. The photoelectric conversion portion PD included in each pixel PX is disposed on a semiconductor layer 10 of the substrate 1. The semiconductor layer 10 is, for example, a single crystal silicon layer epitaxially grown on the substrate 1. The substrate 1 includes, on a main surface 100 side of the semiconductor layer 10, an insulating material 4 for element isolation formed by using, for example, an STI (shallow trench isolation) or LOCOS (local oxidation of silicon) process. A main surface 100 of the semiconductor layer 10 is a light-receiving surface in the image sensing region 2. An impurity region 5 which is a second conductivity-type semiconductor region is provided in a portion in contact with the insulating material 4 of the semiconductor layer 10. The photoelectric conversion portion PD includes a photoelectric conversion region 11 which is a first conductivity-type semiconductor region in which a signal electric charge serves as a majority carrier, and a photoelectric conversion region 12 which is a second conductivity-type semiconductor region in which a signal electric charge serves as a minority carrier. If a signal electric charge is an electron, the first conductivity type is an n type, and the second conductivity type is a p type. If a signal electric charge is a positive hole, the first conductivity type is a p type, and the second conductivity type is an n type. The photoelectric conversion portion PD further includes a first conductivity-type or second conductivity-type photoelectric conversion region 13 located between the photoelectric conversion region 11 and the photoelectric conversion region 12. If the photoelectric conversion region 13 is a first conductivity-type semiconductor region, a first conductivity-type impurity concentration thereof is lower than an impurity concentration of the photoelectric conversion region 11. If the photoelectric conversion region 13 is a second conductivity-type semiconductor region, a second conductivity-type impurity concentration thereof is lower than an impurity concentration of the photoelectric conversion region 12. The photoelectric conversion region 11 functions as an accumulation region for signal electric charges generated in the photoelectric conversion regions 11, 12, and 13. A surface region 14 which is a second conductivity-type semiconductor region is provided between the photoelectric conversion portion PD and the main surface 100 of the semiconductor layer 10, and the photoelectric conversion portion PD is a buried-type photodiode. In the region of the photoelectric conversion portion PD within the semiconductor layer 10, there is included a region in which a depletion layer can spread. That is, the photoelectric conversion portion PD includes at least a portion in which depletion can be achieved by the normal image sensing operation of the image sensing apparatus IS. In the region of the photoelectric conversion portion PD of each pixel, in addition to the portion in which depletion can be achieved, there is also included a portion in which an electric charge is generated by photoelectric conversion and the electric charge is accumulated in the accumulation region. In other words, even when an electric charge is generated by photoelectric conversion in a portion, if the electric charge is not accumulated in the accumulation region of any pixel, the portion is not the photoelectric conversion portion PD of any pixel. At least part of the electric charge detection unit FD is constituted by a floating diffusion 15 disposed on the semiconductor layer 10 of the substrate 1. The capacitance of the electric charge detection unit FD is based on the capacitance of the floating diffusion 15 and wiring capacitance. An electric charge transfer unit TG that transfers a signal electric charge of the photoelectric conversion portion PD from the photoelectric conversion portion PD to the electric charge detection unit FD is disposed on the main surface 100 of the semiconductor layer 10. The electric charge transfer unit TG has a MOS structure including a channel region of the semiconductor layer 10, a gate electrode 18 above the channel region, and a gate insulating film (not illustrated) between the gate electrode 18 and the channel region. To increase transfer efficiency in the electric charge transfer unit TG, part of the photoelectric conversion region 11 functioning as the accumulation region is located beneath the gate electrode 18. Such a structure can be achieved by forming the gate electrode 18 after the photoelectric conversion region 11 is formed. In addition, even in the case where the photoelectric conversion region 11 is formed after the gate electrode 18 is formed, the photoelectric conversion region 11 can be formed beneath the gate electrode 18 by angled ion implantation.

An isolation region 16 which is a second conductivity-type semiconductor region is provided between the pixel PX and a pixel adjacent to the pixel PX on one side of a first side S1 side and a second side S2 side of the pixel PX. Furthermore, an isolation region 17 which is a second conductivity-type semiconductor region is provided between the pixel PX and a pixel adjacent to the pixel PX on one side of the first side S1 side and the second side S2 side of the pixel PX. The photoelectric conversion region 11 is interposed between the isolation region 16 and the isolation region 17 in a direction from the side S1 to the side S2.

The isolation region 16 and the isolation region 17 are disposed at locations deeper from the main surface 100 on which the electric charge transfer unit TG of the pixel PX is disposed than the first conductivity-type photoelectric conversion region 11. Furthermore, the isolation region 16 and the isolation region 17 are disposed at locations shallower from the main surface 100 on which the electric charge transfer unit TG of the pixel PX is disposed than the second conductivity-type photoelectric conversion region 12. In FIG. 2B, a location at which the photoelectric conversion region 11 exhibits a peak impurity concentration is denoted by a depth D1, and a location at which the photoelectric conversion region 12 exhibits a peak impurity concentration is denoted by a depth D2. Furthermore, a location at which the isolation region 16 exhibits a peak impurity concentration is denoted by a depth D3, and a location at which the isolation region 17 exhibits a peak impurity concentration is denoted by a depth D3'. The isolation regions 16 and 17 can be formed so that they are each continuous from a relatively shallow portion to a relatively deep portion of the semiconductor layer 10 by performing a plurality of ion implantation processes which are different in implantation energy. The relatively shallow portion is a portion at the same depth as, for example, the depth D1, and the relatively deep portion is a portion at the same depth as, for example, the depth D2. In this case, the impurity concentration distribution of each of the isolation regions 16 and 17 has a plurality of impurity concentration peaks. The depths D3 and D3' described here are each one of the plurality of impurity concentration peaks. The relationship of D1<D2, the relationship of D3, D3'<D2, and the relationship of D1<D3, D3' hold. The depth D3 and the depth D3' may be the same or different. The second conductivity-type isolation regions 16 and 17 can have a higher impurity concentration than that of the second conductivity-type photoelectric conversion region 12. The second conductivity-type isolation regions 16 and 17 are disposed between the photoelectric conversion regions 12 of adjacent pixels, and thus function as potential barriers. The surface region 14 and the isolation region 17 are continuous with the impurity region 5, and, as a result, the surface region 14, the impurity region 5, and the isolation region 17 are substantially the same in potential.

The structure of semiconductor regions within the pixel PX in a direction along the main surface 100 will be described. A distance (L1) between the photoelectric conversion region 11 and the isolation region 16 is larger than a distance (L2) between the photoelectric conversion region 11 and the isolation region 17. When viewed in plan from a direction facing the main surface 100, the channel region and the gate electrode 18 of the electric charge transfer unit TG of the pixel PX are located between the photoelectric conversion region 11 and the isolation region 16. When viewed in plan from a direction facing the main surface 100, the floating diffusion 15 of the electric charge detection unit FD of the pixel PX is located between the photoelectric conversion region 11 and the isolation region 16. A difference between the distance L1 and the distance L2 roughly corresponds to the sum of the widths of the channel region and the floating diffusion 15. In this exemplary embodiment, at least part of the floating diffusion 15 overlaps the isolation region 16 in a direction perpendicular to the main surface 100. When the isolation region 16 is located too close to the electric charge transfer unit TG, transfer characteristics are reduced, and thus it is desirable that part of the floating diffusion 15 does not overlap the isolation region 16.

The gate electrode 18 is provided on the semiconductor layer 10 with the gate insulating film (not illustrated) interposed between the gate electrode 18 and the semiconductor layer 10, and an antireflection film 19 is provided on the photoelectric conversion portion PD. On the semiconductor layer 10, there is further provided a wiring structure composed of a plurality of plugs 21 and a plurality of wiring layers 22 supported by an interlayer insulating film 20. There are sequentially provided a passivation film 23 covering the interlayer insulating film 20 and the wiring layers 22, a planarizing film 24, a color filter array 25, and a microlens array 26. Furthermore, in order to detect an energy ray, such as an X ray, which is difficult to directly detect with the photoelectric conversion portion PD, there can be provided on the main surface 100 a scintillator that converts an energy ray into a visible light ray.

Figure 3A:
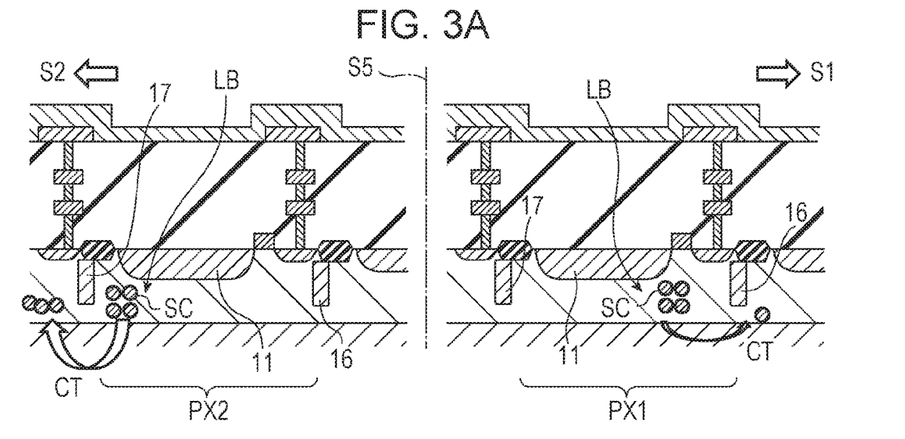
FIGS. 3A to 3C are schematic diagrams each illustrating crosstalk.
Figure 3B:
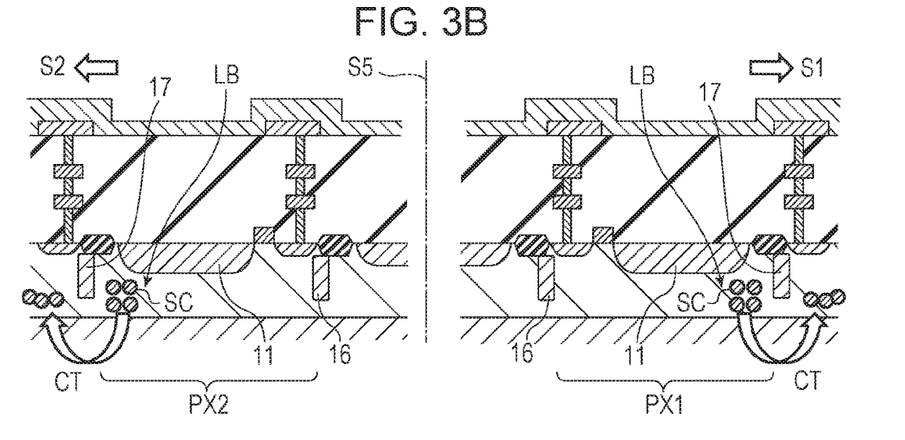
Figure 3C:
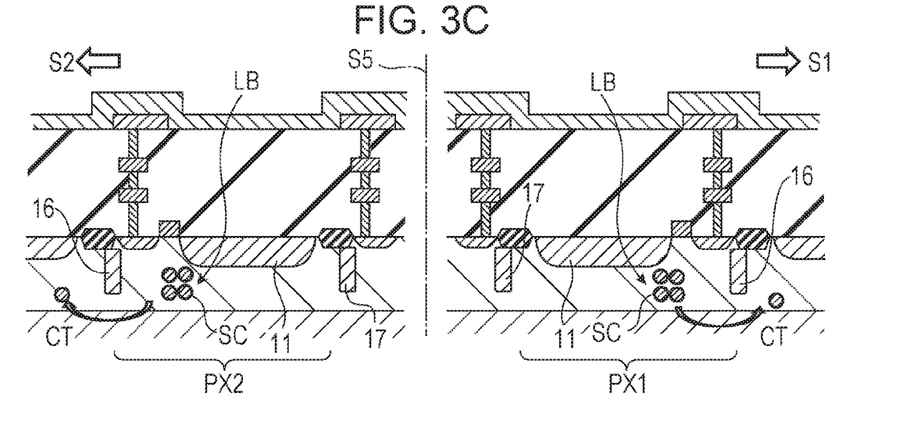

FIGS. 3A to 3C each illustrate crosstalk. FIG. 3A illustrates crosstalk which occurs in the case where the layout of the first pixel PX1 and the second pixel PX2 has translational symmetry with respect to the intermediate line S5. FIGS. 3B and 3C each illustrate crosstalk which occurs in the case where the layout of the first pixel PX1 and the second pixel PX2 has line symmetry with respect to the intermediate line S5.

Signal electric charges SC generated by photoelectric conversion in a deep region of the semiconductor layer 10 may get mixed into adjacent pixels over potential barriers constituted by the respective isolation regions 16 and 17. This causes crosstalk. Signal electric charges generated by photoelectric conversion in proximity to the isolation regions 16 and 17 are more likely to pass over the potential barriers of the isolation regions 16 and 17. Light beams LB entering at an angle with respect to the main surface 100 are likely to generate signal electric charges in proximity to the isolation regions 16 and 17. If the optical system OU of the image sensing system SYS described with reference to FIG. 1C is a non-telecentric optical system, an incident angle of a light beam LB is larger in a peripheral portion than in a center portion of the image sensing region 2. Thus, crosstalk is more likely to occur in the peripheral portion than in the center portion of the image sensing region 2.

As distances between the first conductivity-type photoelectric conversion region 11 in which an electric charge is accumulated and the isolation regions 16 and 17 decrease, the degree of crosstalk increases. For example, crosstalk of one electric charge occurs on a side S1 side in FIG. 3A, whereas crosstalk of three electric charges occurs on a side S2 side. On the other hand, when a line-symmetrical layout as illustrated in FIGS. 3B and 3C is employed, a difference between the degrees of crosstalk on the side S1 side and the side S2 side is small. In the form in FIG. 3B, a distance between the photoelectric conversion region 11 and the isolation region 17 on a travelling direction side of a light beam LB is smaller than a distance between the photoelectric conversion region 11 and the isolation region 16 on the side opposite to the travelling direction of the light beam LB. On the other hand, in the form in FIG. 3C, a distance between the photoelectric conversion region 11 and the isolation region 16 on a travelling direction side of a light beam LB is larger than a distance between the photoelectric conversion region 11 and the isolation region 17 on the side opposite to the travelling direction of the light beam LB. When the form in FIG. 3C is employed, the degree of crosstalk caused by a light beam LB entering at an angle can be reduced in comparison with the case where the form in FIG. 3B is employed. Crosstalk of three electric charges occurs on the side S1 side and the side S2 side in FIG. 3B, for example, whereas the numbers of electric charges of crosstalk occurring on the side S1 side and the side S2 side in FIG. 3C are reduced to one, for example.

A specific example of a layout for reducing the degree of crosstalk will be described with reference to FIGS. 4A and 4B.

Figure 4A:
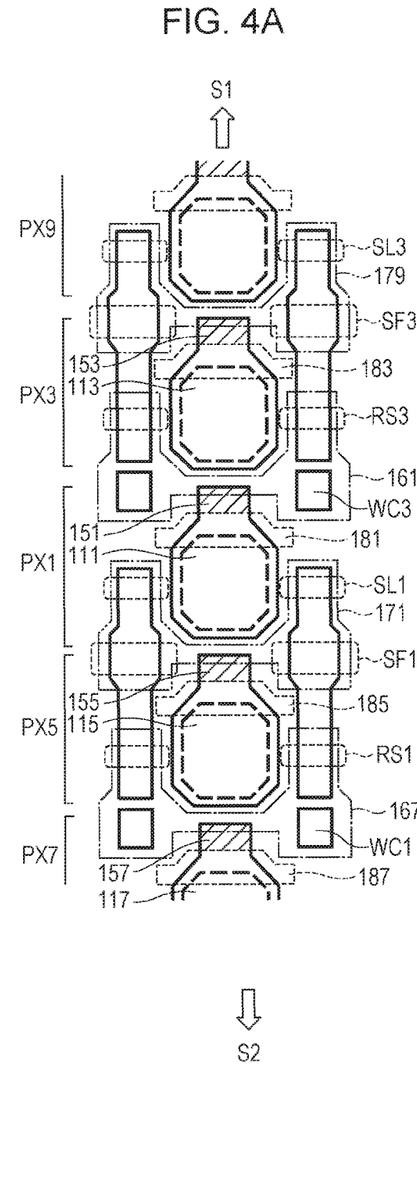
FIGS. 4A and 4B are schematic diagrams illustrating an example of the image sensing apparatus.
Figure 4B:
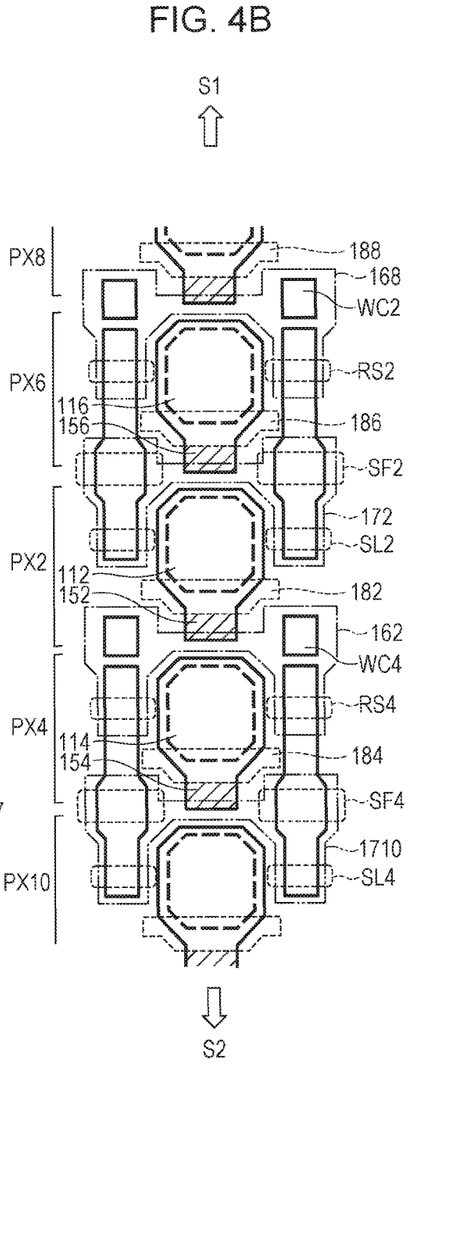

FIG. 4A illustrates a planar layout of the first pixel PX1, the third pixel PX3, and the fifth pixel PX5 in the first portion P1. FIG. 4B illustrates a planar layout of the second pixel PX2, the sixth pixel PX6, and the fourth pixel PX4 in the second portion P2. Hereinafter, assuming that the reference numeral of an element illustrated in FIG. 2B is denoted by M, the reference numeral of an element illustrated in FIG. 2B corresponding to an Nth pixel PXN is denoted by MN. For example, "photoelectric conversion region 112" refers to the photoelectric conversion region 11 in the second pixel PX2. Furthermore, in FIGS. 4A and 4B, solid lines represent boundaries between the insulating material 4 for element isolation and active regions demarcated by the insulating material 4 for element isolation, and dotted lines represent outlines of gate electrodes of the pixel transistors. Long dashed lines represent outlines of photoelectric conversion regions corresponding to the photoelectric conversion region 11, and hatched portions represent floating diffusions corresponding to the floating diffusion 15. Dashed-dotted lines represent outlines of isolation regions corresponding to the isolation region 16, and dashed double-dotted lines represent outlines of isolation regions corresponding to the isolation region 17. Incidentally, when the photoelectric conversion region 11 is viewed in plan from a direction facing the main surface 100, the location of each pixel PX can be identified as a geometric center of gravity of the photoelectric conversion region 11.

The first pixel PX1 and the fifth pixel PX5 share pixel transistors SL1, SF1, and RS1. The second pixel PX2 and the sixth pixel PX6 share pixel transistors SL2, SF2, and RS2. The third pixel PX3 and the ninth pixel PX9 share pixel transistors SL3, SF3, and RS3. The fourth pixel PX4 and the tenth pixel PX10 share pixel transistors SL4, SF4, and RS4. Well contacts WC1, WC2, WC3, and WC4 are second conductivity-type semiconductor regions, and supply a reference potential (ground potential) to second conductivity-type semiconductor regions of the semiconductor layer 10 via the wiring layers 22 and the plugs 21. The second conductivity-type semiconductor regions to which a reference potential is supplied are the impurity region 5, the photoelectric conversion region 12, the surface region 14, and the isolation regions 16 and 17. The isolation region 16 and the isolation region 17 can be electrically continuous via the second conductivity-type photoelectric conversion region 12 and/or surface region 14.

In this exemplary embodiment, the layout of the gate electrodes of the pixel transistors constituting the first pixel PX1 and the layout of the gate electrodes of the pixel transistors constituting the second pixel PX2 are symmetrical to each other with respect to the intermediate line S5.

In the first portion P1, in a direction intersecting the side S1 and the side S2 (at a right angle in this exemplary embodiment), a photoelectric conversion region 111 is interposed between an isolation region 161 and an isolation region 171. In this exemplary embodiment, a semiconductor region having an impurity concentration comparable to that of the photoelectric conversion region 13 is disposed between the isolation region 161 and the isolation region 171, and the isolation region 161 is away from the isolation region 171. However, the isolation region 161 may become continuous with the isolation region 171 so that an isolation region having a depth and an impurity concentration comparable to those of the isolation regions 161 and 171 surrounds the photoelectric conversion region 111. Furthermore, among a plurality of pixels, there may be arranged isolation regions having a depth and an impurity concentration comparable to those of the isolation regions 161 and 171 in a lattice pattern. The same applies in the second portion P2.

As for the first pixel PX1, the isolation region 161 located between the first pixel PX1 and the third pixel PX3 is located on a side S1 side with respect to the photoelectric conversion region 111 of the first pixel PX1. The isolation region 171 located between the first pixel PX1 and the fifth pixel PX5 is located on a side S2 side with respect to the photoelectric conversion region 111 of the first pixel PX1. Then, a distance (corresponding to L1) between the isolation region 161 and the photoelectric conversion region 111 is larger than a distance (corresponding to L2) between the isolation region 171 and the photoelectric conversion region 111.

On the other hand, as for the second pixel PX2, an isolation region 162 located between the second pixel PX2 and the fourth pixel PX4 is located on the side S2 side with respect to a photoelectric conversion region 112 of the second pixel PX2. An isolation region 172 located between the second pixel PX2 and the sixth pixel PX6 is located on the side S1 side with respect to the photoelectric conversion region 112 of the second pixel PX2. Then, a distance (corresponding to L1) between the isolation region 162 and the photoelectric conversion region 112 is larger than a distance (corresponding to L2) between the isolation region 172 and the photoelectric conversion region 112.

Such relationships can suppress crosstalk between adjacent pixels, and reduce a difference in the degree of crosstalk within the image sensing region 2. That is, when the layout relationships of the first pixel PX1 and the second pixel PX2 are relationships like those in FIGS. 4A and 4B, crosstalk occurring in the third pixel PX3 and the fourth pixel PX4 can be suppressed. Furthermore, a difference between the degrees of crosstalk in the third pixel PX3 and the fourth pixel PX4 can be reduced.

Next, as for the fifth pixel PX5, the isolation region 171 located between the first pixel PX1 and the fifth pixel PX5 is located on the side S1 side with respect to a photoelectric conversion region 115 of the fifth pixel PX5. An isolation region 167 located between the fifth pixel PX5 and the seventh pixel PX7 is located on the side S2 side with respect to the photoelectric conversion region 115 of the fifth pixel PX5. Then, a distance (corresponding to L1) between the isolation region 171 and the photoelectric conversion region 115 is larger than a distance (corresponding to L2) between the isolation region 167 and the photoelectric conversion region 115.

On the other hand, as for the sixth pixel PX6, the isolation region 172 located between the second pixel PX2 and the sixth pixel PX6 is located on the side S2 side with respect to a photoelectric conversion region 116 of the sixth pixel PX6. An isolation region 168 located between the sixth pixel PX6 and the eighth pixel PX8 is located on the side S1 side with respect to the photoelectric conversion region 116 of the sixth pixel PX6. Then, a distance (corresponding to L1) between the isolation region 172 and the photoelectric conversion region 116 is larger than a distance (corresponding to L2) between the isolation region 168 and the photoelectric conversion region 116.

Such relationships can suppress crosstalk between adjacent pixels, and reduce a difference in the degree of crosstalk within the image sensing region 2. That is, when the layout relationships of the fifth pixel PX5 and the sixth pixel PX6 are relationships like those in FIGS. 4A and 4B, crosstalk occurring in the first pixel PX1 and the second pixel PX2 can be suppressed. Furthermore, a difference between the degrees of crosstalk in the first pixel PX1 and the second pixel PX2 can be reduced.

In this exemplary embodiment, the layout on the side S1 side and the layout on the side S2 side are symmetrical to each other with respect to the intermediate line S5 between the side S1 and the side S2 extending along rows of pixels. However, the layout on a side S3 side and the layout on a side S4 side may be symmetrical to each other with respect to the intermediate line S6 between the side S3 and the side S4 extending along columns of pixels. This is effective, in particular, in the case where the image sensing region 2 is a rectangle whose long sides are the sides S1 and S2, and whose short sides are the sides S3 and S4. This is because maximum values of incident angles of light beams entering from the non-telecentric optical system are larger in directions connecting a center of the optical system with the short sides (sides S3 and S4) than those in directions connecting the center of the optical system with the long sides (sides S1 and S2). That is, the degree of crosstalk is more likely to increase in the directions connecting the center of the optical system with the short sides (sides S3 and S4).

As illustrated in FIG. 2A, the layout of pixels loses its translational symmetry across the intermediate line S5. Thus, in some cases, a pixel pitch between adjacent pixels in the first region R1, a pixel pitch between adjacent pixels in the second region R2, and a pixel pitch between a pixel in the first region R1 and a pixel in the second region R2 which are adjacent to each other across the intermediate line S5 are different. Such a case may cause a difference in output for the same amount of light between a pixel in the first region R1 and a pixel in the second region R2 which are adjacent to each other across the intermediate line S5. This is because, for example, the magnitude of displacement of a microlens relative to a center of a pixel differs between pixels adjacent to each other across the intermediate line S5. Such pixels between which a difference in output is caused are pixels located between the first pixel PX1 and the second pixel PX2, and are referred to as intermediate pixels. The intermediate pixels are, for example, pixels located equidistant from the first pixel PX1 and the second pixel PX2, or pixels closest to a location equidistant from the first pixel PX1 and the second pixel PX2. As for such intermediate pixels, it is desirable that a difference in output to be caused is measured in advance and then outputs of the intermediate pixels are corrected within the image sensing system SYS. A correction circuit for this can be provided within the image sensing apparatus IS, or in a signal processing device PU different from the signal processing device PU of the image sensing apparatus IS.

When various semiconductor elements constituting each pixel circuit PXC are formed, angled ion implantation is used. For example, in the case where part of the photoelectric conversion region 11 is formed beneath the gate electrode 18, the angled ion implantation is used. In the case where a layout being symmetrical with respect to the intermediate line S5 as illustrated in FIG. 2A is employed, it is desirable to separate a step of performing angled ion implantation in the second region R2 from a step of performing angled ion implantation in the first region R1. Furthermore, it is desirable that an implantation angle of angled ion implantation differs between the first region R1 and the second region R2, for example, that implantation angles are symmetrical to each other with respect to the intermediate line S5. Thus, a step of separating an implantation step of angled ion implantation into the step in the first region R1 and the step in the second region R2 is added. However, for example, when the gate electrode 18 is formed after the photoelectric conversion region 11 is formed, such addition of the step can be suppressed.

Figure 5:
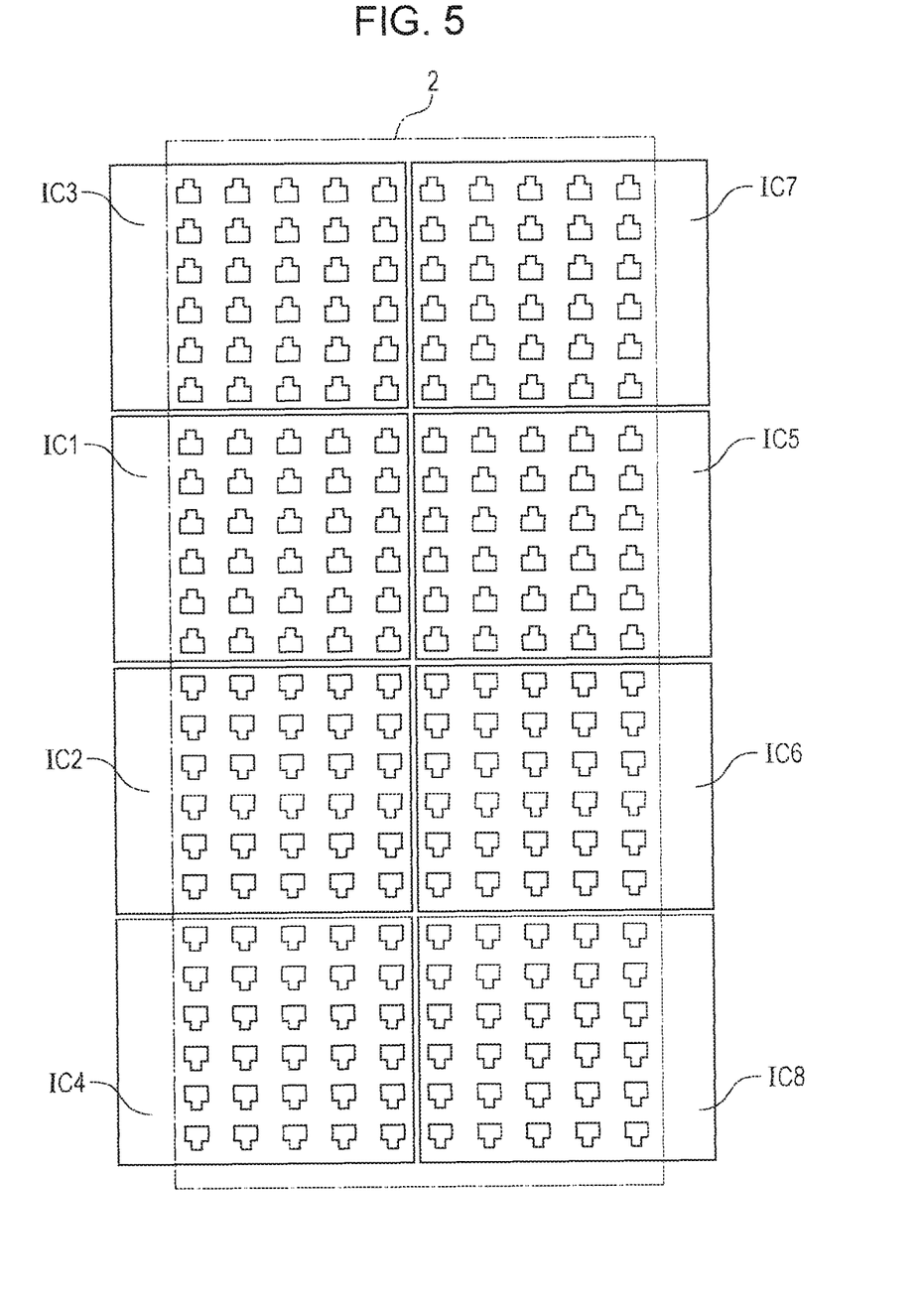
FIG. 5 is a schematic diagram illustrating an example of an image sensing apparatus.

FIG. 5 illustrates an exemplary embodiment of an image sensing apparatus including one image sensing region 2 in which a plurality of image sensing devices IC1 to IC8 are arranged. The image sensing devices IC1 to IC8 have separate semiconductor layers. The image sensing devices IC1, IC3, IC6, and IC8 have the same layout, and the image sensing devices IC2, IC4, IC5, and IC7 have the same layout. Layouts above and below a boundary between the image sensing device IC1 and the image sensing device IC2 are symmetrical to each other, and layouts above and below a boundary between the image sensing device IC5 and the image sensing device IC6 are symmetrical to each other. For this reason, a plurality of pixels having a relationship of line symmetry with each other are provided in the separate semiconductor layers of the respective image sensing devices IC1 to IC8.

This can suppress crosstalk occurring in the image sensing device IC1 and the image sensing device IC2, and reduce a difference in the degree of crosstalk between the image sensing device IC1 and the image sensing device IC2. In such a form, it is noted that the layout of pixels maintains its translational symmetry in the image sensing region 2 of one image sensing device IC. Thus, this facilitates formation of an impurity region through angled ion implantation of an impurity into the semiconductor layer 10.

The above-described exemplary embodiments can be appropriately varied without departing from the scope of the technical idea of the present disclosure. Although a complementary metal-oxide-semiconductor (CMOS) image sensor has been given as an example in the above-described exemplary embodiments, the exemplary embodiments are also applicable to a charge-coupled device (CCD) image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-253532, filed Dec. 15, 2014, which is hereby incorporated by reference herein in its entirety.

What is claimed is:

1. An image sensing system comprising
a plurality of pixels arranged in an image sensing region which is a quadrilateral having a first side and a second side facing the first side, the plurality of pixels each including a photoelectric conversion portion,
wherein the plurality of pixels include:
a first pixel disposed at a location closer to the first side than to the second side, a distance between the first side and the first pixel being shorter than a distance between the second side and the first pixel;
a second pixel disposed at a location closer to the second side than to the first side, a distance between the second side and the second pixel being shorter than a distance between the first side and the first pixel;
a third pixel adjacent to the first pixel on a side toward the first side of the first pixel, the third pixel being arranged between the first side and the first pixel;
a fourth pixel adjacent to the second pixel on a side toward the second side of the second pixel, the fourth pixel being arranged between the second side and the second pixel;
a fifth pixel adjacent to the first pixel on a side toward the second side of the first pixel, the fifth pixel being arranged between the second side and the first pixel; and
a sixth pixel adjacent to the second pixel on a side toward the first side of the second pixel, the sixth pixel being arranged between the first side and the second pixel,
wherein the photoelectric conversion portion of the first pixel includes a first accumulation region which is a first conductivity-type semiconductor region that accumulates a signal electric charge,
wherein a first isolation region which is a second conductivity-type semiconductor region is provided between the photoelectric conversion portion of the first pixel and a photoelectric conversion portion of the third pixel,
wherein a second isolation region which is a second conductivity-type semiconductor region is provided between the photoelectric conversion portion of the first pixel and a photoelectric conversion portion of the fifth pixel,
wherein the first isolation region and the second isolation region are disposed at locations deeper from a light-receiving surface than the first accumulation region,
wherein a first distance between the first accumulation region and the first isolation region is larger than a second distance between the first accumulation region and the second isolation region, wherein the photoelectric conversion portion of the second pixel includes a second accumulation region which is a first conductivity-type semiconductor region that accumulates a signal electric charge, wherein a third isolation region which is a second conductivity-type semiconductor region is provided between the photoelectric conversion portion of the second pixel and a photoelectric conversion portion of the fourth pixel, wherein a fourth isolation region which is a second conductivity-type semiconductor region is provided between the photoelectric conversion portion of the second pixel and a photoelectric conversion portion of the sixth pixel, wherein the third isolation region and the fourth isolation region are disposed at locations deeper from the light-receiving surface than the second accumulation region, and wherein a third distance between the second accumulation region and the third isolation region is larger than a fourth distance between the second accumulation region and the fourth isolation region.

2. The image sensing system according to claim 1, wherein the plurality of pixels each include an electric charge detection unit, and an electric charge transfer unit that transfers a signal electric charge from the photoelectric conversion portion to the electric charge detection unit, wherein, when viewed in plan from a direction facing the light-receiving surface, an electric charge transfer unit of the first pixel is located between the first accumulation region and the first isolation region, and an electric charge transfer unit of the second pixel is located between the second accumulation region and the third isolation region, and wherein when viewed in plan from the direction facing the light-receiving surface, an electric charge transfer unit of the fifth pixel is located between the first accumulation region and the photoelectric conversion portion of the fifth pixel, and an electric charge transfer unit of the sixth pixel is located between the second accumulation region and the photoelectric conversion portion of the sixth pixel.

3. The image sensing system according to claim 1, wherein the first pixel and the fifth pixel share first pixel transistors, and the second pixel and the sixth pixel share second pixel transistors.

4. The image sensing system according to claim 2, wherein an electric charge detection unit to which a signal electric charge is transferred from the photoelectric conversion portion of the first pixel includes a first floating diffusion which is a first conductivity-type semiconductor region, and at least part of the first floating diffusion overlaps the first isolation region, and wherein an electric charge detection unit to which a signal electric charge is transferred from the photoelectric conversion portion of the second pixel includes a second floating diffusion which is a first conductivity-type semiconductor region, and at least part of the second floating diffusion overlaps the third isolation region.

5. The image sensing system according to claim 2, wherein the photoelectric conversion portion of the first pixel includes a first photoelectric conversion region which is a second conductivity-type semiconductor region disposed at a location deeper from the light-receiving surface than the first accumulation region, the first isolation region, and the second isolation region, and wherein the photoelectric conversion portion of the second pixel includes a second photoelectric conversion region which is a second conductivity-type semiconductor region disposed at a location deeper from the light-receiving surface than the second accumulation region, the third isolation region, and the fourth isolation region.

6. The image sensing system according to claim 5, wherein the first isolation region and the second isolation region are higher in impurity concentration than the first photoelectric conversion region, and wherein the third isolation region and the fourth isolation region are higher in impurity concentration than the second photoelectric conversion region.

7. The image sensing system according to claim 1, wherein a layout of a gate electrode of a transistor constituting the first pixel and a layout of a gate electrode of a transistor constituting the second pixel are symmetrical to each other with respect to a line which is located equidistant from the first pixel and the second pixel and extends along the first side and the second side.

8. The image sensing system according to claim 1, wherein, in the image sensing region, an image sensing device in which the first pixel is disposed and an image sensing device in which the second pixel is disposed are arranged.

9. The image sensing system according to claim 1, further comprising
a correction circuit that corrects an output of a pixel located between the first pixel and the second pixel.

10. The image sensing system according to claim 1, further comprising
a non-telecentric optical system that forms an image on the image sensing region.

11. The image sensing system according to claim 3, wherein an electric charge detection unit to which a signal electric charge is transferred from the photoelectric conversion portion of the first pixel includes a first floating diffusion which is a first conductivity-type semiconductor region, and at least part of the first floating diffusion overlaps the first isolation region, and wherein an electric charge detection unit to which a signal electric charge is transferred from the photoelectric conversion portion of the second pixel includes a second floating diffusion which is a first conductivity-type semiconductor region, and at least part of the second floating diffusion overlaps the third isolation region.

12. The image sensing system according to claim 3, wherein the photoelectric conversion portion of the first pixel includes a first photoelectric conversion region which is a second conductivity-type semiconductor region disposed at a location deeper from the light-receiving surface than the first accumulation region, the first isolation region, and the second isolation region, and wherein the photoelectric conversion portion of the second pixel includes a second photoelectric conversion region which is a second conductivity-type semiconductor region disposed at a location deeper from the light-receiving surface than the second accumulation region, the third isolation region, and the fourth isolation region.

13. The image sensing system according to claim 12,
wherein the first isolation region and the second isolation region are higher in impurity concentration than the first photoelectric conversion region, and
wherein the third isolation region and the fourth isolation region are higher in impurity concentration than the second photoelectric conversion region.

14. The image sensing system according to claim 3,
wherein a layout of a gate electrode of a transistor constituting the first pixel and a layout of a gate electrode of a transistor constituting the second pixel are symmetrical to each other with respect to a line which is located equidistant from the first pixel and the second pixel and extends along the first side and the second side.

15. The image sensing system according to claim 3,
wherein, in the image sensing region, an image sensing device in which the first pixel is disposed and an image sensing device in which the second pixel is disposed are arranged.

16. The image sensing system according to claim 3, further comprising
a correction circuit that corrects an output of a pixel located between the first pixel and the second pixel.

17. The image sensing system according to claim 3, further comprising
a non-telecentric optical system that forms an image on the image sensing region.

* * * * *